US010608413B2

(12) United States Patent
Gerhard et al.

(10) Patent No.: US 10,608,413 B2
(45) Date of Patent: Mar. 31, 2020

(54) LASER ASSEMBLY AND OPERATING METHOD

(71) Applicant: OSRAM Opto Semiconductors GmbH, Regensburg (DE)

(72) Inventors: Sven Gerhard, Alteglofsheim (DE); Clemens Vierheilig, Tegernheim (DE); Andreas Löffler, Neutraubling (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/099,644

(22) PCT Filed: Apr. 27, 2017

(86) PCT No.: PCT/EP2017/060082
§ 371 (c)(1),
(2) Date: Nov. 7, 2018

(87) PCT Pub. No.: WO2017/194320
PCT Pub. Date: Nov. 16, 2017

(65) Prior Publication Data
US 2019/0157844 A1    May 23, 2019

(30) Foreign Application Priority Data

May 11, 2016   (DE) .................. 10 2016 108 700

(51) Int. Cl.
*H01S 5/40* (2006.01)
*H01S 5/042* (2006.01)
(Continued)

(52) U.S. Cl.
CPC ............ *H01S 5/4018* (2013.01); *H01S 5/042* (2013.01); *H01S 5/0683* (2013.01); *H01S 5/06825* (2013.01); *H01S 5/4031* (2013.01)

(58) Field of Classification Search
CPC ...... H01S 5/4018; H01S 5/4031; H01S 5/042; H01S 5/06825; H01S 5/0683
See application file for complete search history.

(56) References Cited

U.S. PATENT DOCUMENTS 5,132,982 A    7/1992 Chan et al.
5,404,373 A    4/1995 Cheng
(Continued)

FOREIGN PATENT DOCUMENTS

DE    102004056621 A1    2/2006

OTHER PUBLICATIONS

International Search Report and Written Opinion dated Jul. 19, 2017 in International (PCT) Application No. PCT/EP2017/060082, and English translation of Search Report only (10 pages).
(Continued)

*Primary Examiner* — Xinning(Tom) Niu
(74) *Attorney, Agent, or Firm* — McDermott Will & Emery LLP

(57) ABSTRACT

The invention relates to a laser assembly, wherein, in one embodiment, the laser assembly (1) comprises a plurality of laser groups (2) each having at least one semiconductor laser (20). Furthermore, the laser assembly (1) contains a plurality of photothyristors (3), each laser group (2) being clearly assigned one of the photothyristors (3). The photothyristors (3) are each connected electrically in series with the associated laser group (2) and/or integrated in the associated laser group (2). Furthermore, the photothyristors (3) are each optically coupled to the associated laser group (2). A dark breakdown voltage (Ut) of each photothyristor (3) lies above an intended operating voltage (Ub) of the associated laser group (2).

17 Claims, 3 Drawing Sheets

Figure 1:
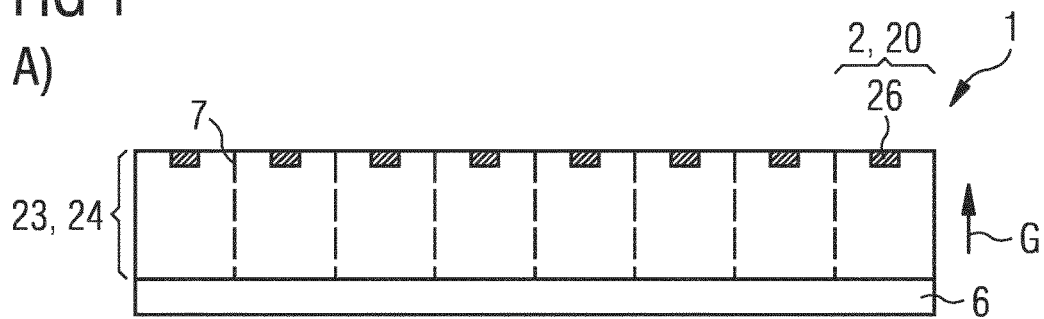

(51) Int. Cl.
    *H01S 5/068*     (2006.01)
    *H01S 5/0683*     (2006.01)

(56) References Cited

U.S. PATENT DOCUMENTS 5,572,540 A * 11/1996 Cheng .................. H01S 5/0262
                                                                                                          372/38.07
6,479,844 B2    11/2002 Taylor

OTHER PUBLICATIONS

Bright, TO. "Efficient blue light-emitting diodes leading to bright and energy-saving white light sources." Sci. Backgr. Noble Prize Phys., Oct. 7, 2014 (10 pages).

Slipchenko, Sergey O., et al. "High-Power Pulse Semiconductor Laser-Thyristor Emitting at 900-nm Wavelength" IEEE Photonics Technology Letters, vol. 25, No. 17, pp. 1664-1667, Sep. 1, 2013.

Slipchenko, Sergey O., et al. "Model of Steady-State Injection Processes in a High-Power Laser-Thyristor Based on Heterostructure with Internal Optical Feedback." IEEE Transactions on Electron Devices, vol. 62, No. 1, pp. 149-154, Jan. 2015.

* cited by examiner

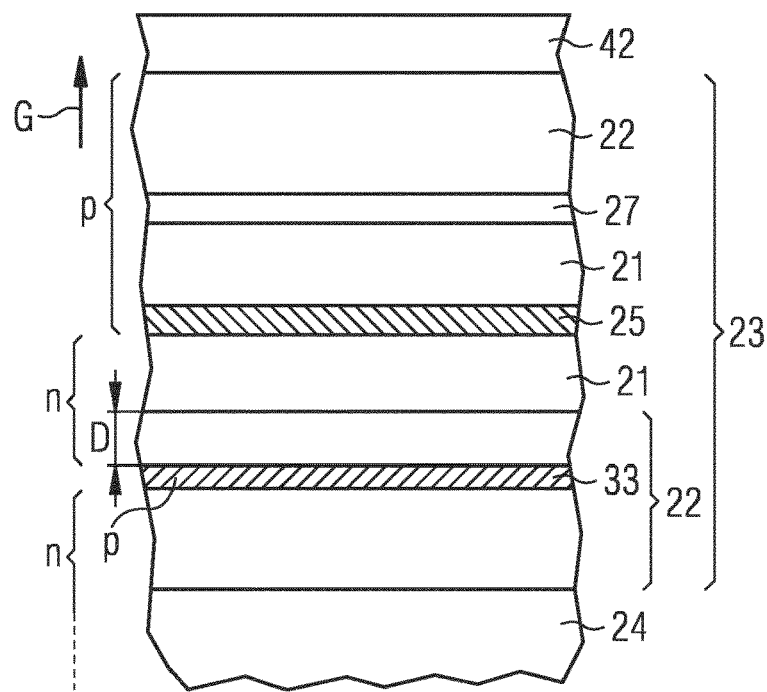
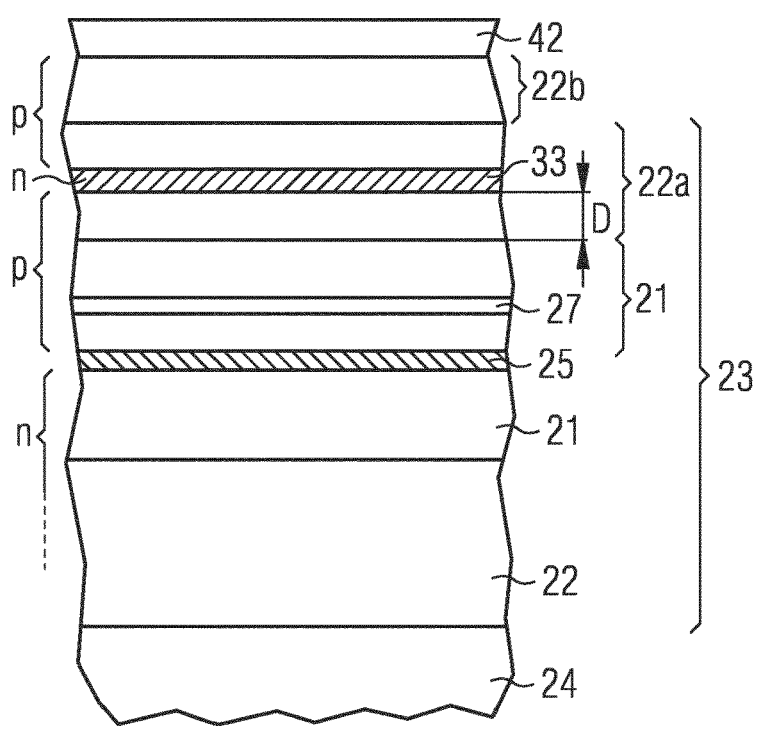

FIG 5
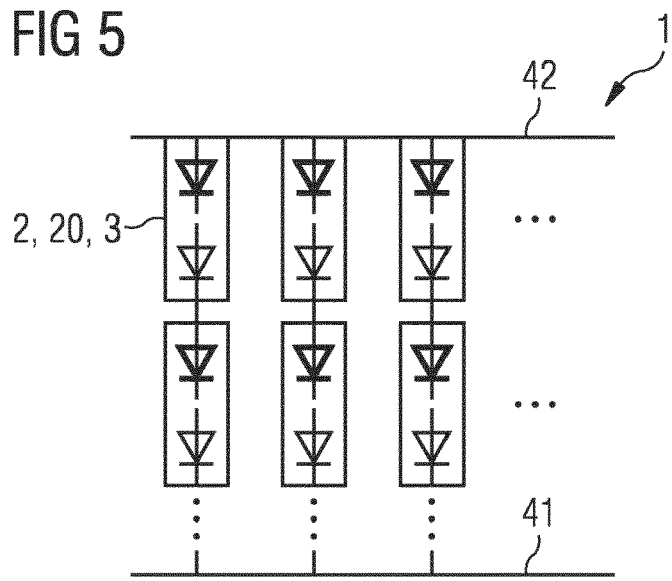
FIG 6
A) 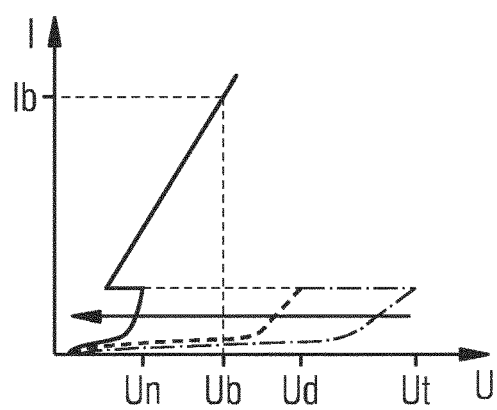
B) 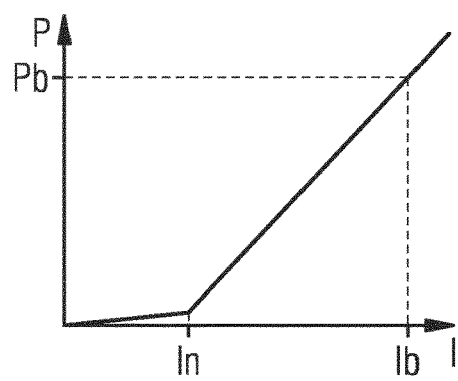
FIG 7
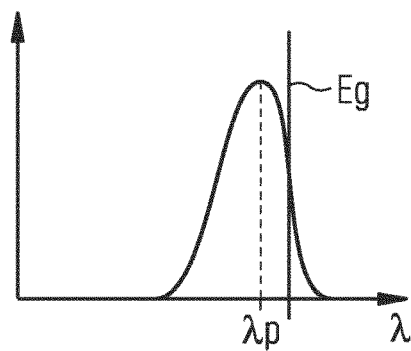

LASER ASSEMBLY AND OPERATING METHOD

RELATED APPLICATIONS

This application is a United States National Phase under 35 U.S.C. § 371 of International Application No. PCT/EP2017/060082, filed on Apr. 27, 2017, which claims priority to German Patent Application No. 102016108700.9, filed May 11, 2016, both of which are hereby incorporated by reference in their entirety for all purposes.

The invention relates to a laser arrangement. The invention further relates to an operating method for such a laser arrangement.

An object of the invention is to provide a laser arrangement having a plurality of semiconductor lasers which can be efficiently operated even with individual defective semiconductor lasers.

This object is achieved, inter alia, by a laser arrangement and by an operating method having the features of the independent patent claims. Preferred developments are the subject matter of the remaining claims.

According to at least one embodiment, the laser arrangement emits laser radiation during proper operation. The laser arrangement can be operated in pulsed mode or continuous wave mode, cw for short.

According to at least one embodiment, the laser arrangement comprises a plurality of laser groups. Each of the laser groups comprises one or more semiconductor lasers. The laser groups preferably each consist of exactly one semiconductor laser so that the terms laser group and semiconductor laser can be synonyms. Semiconductor laser means that the laser radiation generated during operation of the laser arrangement stems from charge carrier recombination in an in particular inorganic semiconductor material. The semiconductor lasers are solid-state lasers. The semiconductor lasers can also be referred to as emitters or laser emitters.

According to at least one embodiment, the laser arrangement comprises a plurality of photothyristors. A photothyristor, as well as a normal thyristor, has a voltage-dependent resistance. Above a breakdown voltage, the photothyristor is electrically conductive, but only poorly conductive below the breakdown voltage. In the case of a photothyristor, the breakdown voltage additionally depends on an illumination intensity. The breakdown voltage drops with increasing illumination intensity of the photothyristor or a photosensitive layer of the photothyristor. Without incident light, the breakdown voltage is therefore highest, in the present case also referred to as the dark breakdown voltage.

According to at least one embodiment, each of the laser groups is uniquely assigned to one of the photothyristors. In particular, a 1:1 assignment exists between the semiconductor lasers and the photothyristors.

According to at least one embodiment, the photothyristors are each electrically connected to the associated laser group, in particular with the associated semiconductor laser, in series and/or are integrated into the associated laser group. "Integrated" can mean that the laser group and the photothyristor share at least some components, for example semiconducting layers.

According to at least one embodiment, the photothyristors are optically coupled to the associated laser group. This means that radiation generated in the respective laser group during proper operation can at least partially reach the associated photothyristor. In particular, the photothyristor and the associated laser group are configured monolithically and/or in one piece, so that no separate optical components such as deflecting mirrors or lenses are located between the photothyristor and the associated laser group, so that radiation from the laser group to the photothyristor has only to pass through solids, in particular only through semiconductor materials.

According to at least one embodiment, the dark breakdown voltage of the photothyristors is in each case above an intended operating voltage of the associated laser group. The intended operating voltage is approximately the voltage at which the laser arrangement is to be operated at the provided power parameters. For example, the intended operating voltage is at least 0.3 V or 0.5 V or 0.7 V above a laser threshold voltage at which the generation of laser radiation begins.

In at least one embodiment, the laser arrangement comprises a plurality of laser groups each having at least one semiconductor laser. Furthermore, the laser arrangement comprises a plurality of photothyristors so that each of the laser groups is uniquely assigned to one of the photothyristors. The photothyristors are each electrically connected in series with the associated laser group and/or integrated into the associated laser group. Furthermore, the photothyristors are each optically coupled to the associated laser group. A dark breakdown voltage of the photothyristors is in each case above an intended operating voltage of the associated laser group.

Due to the comparatively high defect density in the semiconductor material in lasers based on AlInGaN, the yield of emitters with good electro-optical data is significantly lower than, for example, in the InGaAs material system. This is an essential problem in the production of laser bars for high-performance applications such as material processing or projection applications, in particular at laser wavelengths in the range of 350 nm to 590 nm. Therefore, one or more emitters are often located on an AlInGaN bar, said emitters not reaching the laser threshold or having electro-optical data outside the specifications. This reduces the yield of laser bars in the AlInGaN material system to relatively low values, if all bars that comprise emitters which are not functioning as specified would be sorted out. Production of laser bars in this material system would thereby be greatly impaired in its economic efficiency.

If the non-properly functioning emitters remain in the bar, however, these emitters are supplied with current in a conventional parallel connection of all emitters, but do not contribute to a laser light yield. As a result, the efficiency of the laser bar is greatly reduced. In addition, the non-properly functioning emitters heat up because of the current flow through these emitters even more than the functioning emitters, which additionally reduces the overall efficiency of the laser bar. In addition, a technical realization of laser bars in the visible spectral range is made very difficult or impossible due to thermal overheating of the component.

In the laser arrangement described here, by means of the photothyristor, which can be integrated into the epitaxially grown structure for the semiconductor lasers, an electrical separation of the non-properly functioning emitters on the laser bar from a current supply is achieved.

Currently, no laser bars having emission wavelengths in the range between 350 nm and 590 nm are available on the market. Individual laser diodes are customary in housings, in particular of the TO design. However, such TO laser diodes are limited in their optical output power and are typically sufficient only up to optical output powers of significantly less than 10 W. For many fields of application such as in projection or material processing, however, optical output powers of 10 W or more or, preferably, of at least 100 W are required.

Alternatively, a plurality of individual emitters are mounted on or in a heat sink. As a result, high output powers can be achieved, for example in the blue spectral range. Due to the individual mounting of the emitters, however, cost disadvantages arise due to a more complicated production of the individual emitters and by the more complex assembly and by the need for an adjustment and more complicated optics, in order to further process the generated laser beams.

In the laser arrangement described here, the semiconductor lasers are preferably arranged in a laser bar so that the semiconductor lasers can be mounted together and relative to one another without adjustment. Thus, the semiconductor lasers also have very similar emission properties, which considerably simplifies the further handling of the laser radiation.

According to at least one embodiment, the semiconductor lasers each have a semiconductor layer sequence. The associated photothyristor is particularly preferably integrated in said semiconductor layer sequence.

According to at least one embodiment, a pnpn sequence is present in each of the semiconductor layer sequences, said sequence comprising the associated photothyristor and the associated active zone of the corresponding semiconductor laser. The letters n and p represent n-conducting and p-conducting zones. Alternatively, it is possible for the semiconductor layer sequences to have a respective pipn sequence or an ninp sequence, wherein the letter i stands for an intrinsically conductive region of the semiconductor layer sequence. The differently conductive regions of the semiconductor layer sequence are preferably realized by means of dedicated layers or layer stacks in the semiconductor layer sequence.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or as $Al_nGa_mIn_{1-n-m}As_kP_{1-k}$, wherein in each case $0 \leq n \leq 1$, $0 \leq m \leq 1$ and $n+m \leq 1$ and $0 \leq k < 1$. In particular, the following applies to at least one layer or to all layers of the semiconductor layer sequence: $0 < n \leq 0.8$, $0.4 \leq m < 1$ and $n+m \leq 0.95$ and $0 < k \leq 0.5$. The semiconductor layer sequence can have dopants and additional components. For the sake of simplicity, however, only the essential components of the crystal lattice of the semiconductor layer sequence are mentioned, that is Al, As, Ga, In, N or P, even if these can be partially replaced and/or supplemented by small quantities of further substances. The semiconductor layer sequence is particularly preferably based on the material system AlInGaN.

According to at least one embodiment, all semiconductor lasers of the laser arrangement are produced from a common semiconductor layer sequence. In this case, the semiconductor layer sequence can extend contiguously and continuously over all semiconductor lasers. Alternatively, the semiconductor layer sequence between adjacent semiconductor lasers is partially or completely removed, wherein a position of the semiconductor lasers relative to one another is preferably not changed by the removal of semiconductor material between the semiconductor lasers.

According to at least one embodiment, the semiconductor lasers are arranged on a common growth substrate. The growth substrate is, for example, a GaN substrate on which the semiconductor layer sequence is grown epitaxially.

According to at least one embodiment, the laser arrangement is configured to generate visible laser radiation. A peak wavelength, also referred to as the wavelength of maximum intensity, is preferably at at least 400 nm or 420 nm or 440 nm and/or at at most 590 nm or 540 nm or 495 nm or 470 nm. Alternatively, the peak wavelength is in the near ultraviolet spectral range, for example at at least 350 nm or 370 nm or 385 nm and/or at at most 400 nm.

According to at least one embodiment, the photothyristors each comprise an absorber layer. The absorber layer is designed to absorb part of the radiation generated during operation of the associated laser group. A conductivity of the photothyristor, in particular of the absorber layer, is increased by means of said absorbed laser radiation.

According to at least one embodiment, the absorber layer is located on or in a cladding layer of the associated semiconductor laser. In other words, the absorber layer of the photothyristor is embedded in a functional layer of the semiconductor laser. Compared to the layer in which the absorber layer is embedded, the absorber layer has an opposite or intrinsic conductivity. If the cladding layer is, for example, an n-doped layer, thus, the absorber layer is p-doped or intrinsically conductive.

According to at least one embodiment, the semiconductor laser comprises at least one waveguide layer. The waveguide layer preferably directly adjoins the active zone, in particular on both sides of the active zone. In the preferably exactly two waveguide layers, together with the active zone, the generated laser radiation is guided.

According to at least one embodiment, an evanescent field of the laser radiation guided in the at least one waveguide layer reaches as far as the absorber layer. The absorber layer thus absorbs portions of the guided laser radiation out of the evanescent field. Thus, the laser radiation is not directly directed onto the absorber layer, but is preferably guided parallel to the absorber layer. It is possible for the absorber layer to absorb radiation exclusively from the evanescent field and/or in such a way that scattered radiation of the laser radiation reaches the absorber layer.

According to at least one embodiment, the absorber layer has an absorption edge. The absorption edge corresponds to a band gap of a semiconductor material of the absorber layer. For the absorption edge Eg, one of the following relationships applies: $Eg \leq h \, c/(\lambda p - 5 \, nm)$ or $Eg \leq h \, c/\lambda p$ or $Eg \leq h \, c/(\lambda p + 5 \, nm)$. In this case, $\lambda p$ stands for the peak wavelength of the associated laser radiation, h denotes the Planck constant and c denotes the vacuum light velocity. The absorption edge therefore preferably lies at the peak wavelength or at higher wavelengths. Alternatively, it is possible for the absorption edge to be formed in a blue, that is to say short-wave, flank of the emission spectrum of the associated laser group.

According to at least one embodiment, the absorber layer absorbs a relatively small proportion of the laser radiation. The proportion of the laser radiation which is absorbed by the absorber layer is preferably at most 5% or 2% or 0.3%. In particular, this proportion is at least 0.01% or 0.1% or 0.25%.

According to at least one embodiment, the following applies to a distance D between the absorber layer and the waveguide layer with regard to the peak wavelength $\lambda p$ and to a refractive index n of the associated cladding layer: $0.1 \, n \, \lambda p \leq D$ or $0.25 \, n \, \lambda p \leq D$ or $0.4 \, n \, \lambda p \leq D$ and/or $D \leq n \, \lambda p$ or $D \leq 0.75 \, n \, \lambda p$ or $D \leq 0.5 \, n \, \lambda p$.

According to at least one embodiment, the absorber layer has a thickness of at least 10 nm or 20 nm or 30 nm or 50 nm. Alternatively or additionally, the thickness of the absorber layer is at most 1 µm or 500 nm or, preferably, at most 150 nm. In particular, the absorber layer is thinner than the cladding layer into which the absorber layer is introduced by at least a factor of 2 or 5 or 10.

According to at least one embodiment, the absorber layer is p-doped or intrinsically conductive. In this case, the cladding layer is n-doped. Alternatively, the absorber layer is n-doped or intrinsically conductive and the cladding layer is p-doped.

According to at least one embodiment, the absorber layer is composed of the material system $Al_xIn_yGa_{1-x-y}N$. Alternatively or additionally, the cladding layer is made of the material system $Al_zGa_{1-z}N$. Preferably, it applies that $0 \le x, y, z$ or $0 < x, z$ or $0.01 \le x, y, z$ or $0.04 \le x, y, z$ and/or $x, y, z \le 0.2$ or $x, y, z \le 0.1$ or $x, y, z \le 0.06$, in each case for x, y, z together or independently of one another only for x or only for y or only for z or only for x and z or only for y and z or only for x and y.

According to at least one embodiment, the dark breakdown voltage of the photothyristor is at least 0.2 V or 0.3 V or 0.4 V and/or at most 1.5 V or 1 V or 0.8 V greater than the intended operating voltage of the associated laser group. The intended operating voltage is preferably at least 3.5 V and/or at most 8 V or 6 V.

According to at least one embodiment, adjacent laser groups and/or adjacent semiconductor lasers are optically isolated from one another. Optical isolation can be used to prevent the photothyristors from receiving radiation from adjacent laser groups and/or semiconductor lasers during operation. By means of the optical isolation, optical crosstalk is preferably reduced by at least a factor of 5 or 10 or 100, compared to a laser arrangement without corresponding optical insulations. The optical insulation is formed, for example, by a trench in the semiconductor layer sequence; said trench can additionally be provided with a reflector and/or an absorber for the laser radiation.

According to at least one embodiment, the laser arrangement is configured to be edge-emitting. An emission direction of the laser radiation is thus preferably oriented perpendicular to a growth direction of the semiconductor layer sequence.

According to at least one embodiment, the laser arrangement is a laser bar. The semiconductor lasers are preferably still located on the common growth substrate and are mechanically fixedly coupled to one another. The laser arrangement is thus produced and handled as a single component, in particular coming from a wafer.

According to at least one embodiment, all laser groups and/or semiconductor lasers are arranged next to one another when viewed in plan view. Resonators of the individual laser groups and/or semiconductor lasers are preferably oriented parallel to one another so that all semiconductor lasers radiate the laser radiation parallel to one another. Preferably, no semiconductor lasers are arranged one behind the other, relative to a direction parallel to the resonator axes.

According to at least one embodiment, exactly two electrical connections are present per laser group. In particular, no separate electrical connection is provided for the photothyristor.

According to at least one embodiment, the laser arrangement, in particular the laser bar, comprises at least 2 or 5 or 10 or 15 of the laser groups. Alternatively or additionally, the laser arrangement has at most 150 or 100 or 60 or 40 of the laser groups and/or of the semiconductor lasers.

According to at least one embodiment, the laser arrangement is configured to emit an optical power of the laser radiation of at least 10 W or 15 W at the intended operating voltage. In the case of pulsed laser radiation, this preferably applies to the temporal average.

According to at least one embodiment, the laser arrangement comprises n×m laser groups. The laser groups are preferably arranged in an n×m matrix. n and m are natural numbers. Preferably, $n<m$ or $n \le \sqrt{m}$. Further, preferably it applies that $2 \le n \le 6$ and/or $5 \le m \le 25$.

According to at least one embodiment, part of the laser groups or all laser groups are electrically connected in parallel to one another.

According to at least one embodiment, n of the laser groups are electrically connected in series. In this case, m series connections are preferably present of which, in particular, each has n laser groups. The m series connections can be electrically connected in parallel with one another.

According to at least one embodiment, only some of the laser groups are operated during normal operation of the laser arrangement. That is, when the intended operating voltage is applied, laser radiation is generated only in some of the laser groups. The laser groups and/or semiconductor lasers that do not generate laser radiation are defective and/or have an increased laser threshold. The defective laser groups are electrically decoupled by the associated photothyristor so that no or no significant current flows through the at least one decoupled laser group during operation. This can mean that a current flow through the at least one decoupled, defective laser groups at the operating voltage is reduced by at least a factor of 2 or 5 or 10 or 25 or 100 relative to the current flow through the normally functioning laser groups. In other words, the photothyristor acts as a switch that decouples defective laser groups and prevents a significant current flow through the defective laser groups.

The invention further relates to an operating method. At least one laser arrangement, as indicated in connection with one or more of the above-mentioned embodiments, is operated with the operating method. Features for the operating method are therefore also disclosed for the laser arrangement and vice versa.

According to the operating method, the laser arrangement comprises at least one defective laser group having an increased laser threshold voltage or laser threshold. The increased laser threshold voltage is greater than the intended operating voltage; in particular, the laser threshold voltage of the defective laser groups is by at least 0.3 V or 0.5 V or 0.7 V greater than the intended operating voltage. The increased laser threshold voltage can be smaller or else greater than the dark breakdown voltage of the associated photothyristor. A normal laser threshold voltage, beginning from which the laser radiation is generated, of the properly functioning laser groups is below the intended operating voltage, for example by at least 0.2 V or 0.3 V or 0.5 V or 0.7 V. Thus, the associated photothyristor is illuminated with the generated laser radiation, in particular from the evanescent field, and switched through only in such laser groups which function correctly. In contrast, in the case of the at least one defective laser group, no or only very little laser radiation is generated at the intended operating voltage so that the associated photothyristor is not illuminated or is not sufficiently illuminated. In this way, it is achieved that the at least one defective laser group in any case remains electrically decoupled up to the intended operating voltage, and a current flow through the at least one defective laser group is smaller by at least a factor of 10 than through each of the correctly functioning laser groups.

A laser arrangement described here and an operating method described here are explained in more detail below with reference to the drawing on the basis of exemplary embodiments. Identical reference signs indicate the same elements in the individual figures. In this case, however, no relationships to scale are illustrated, but rather individual elements can be represented with an exaggerated size in order to afford a better understanding.

Figure 2:
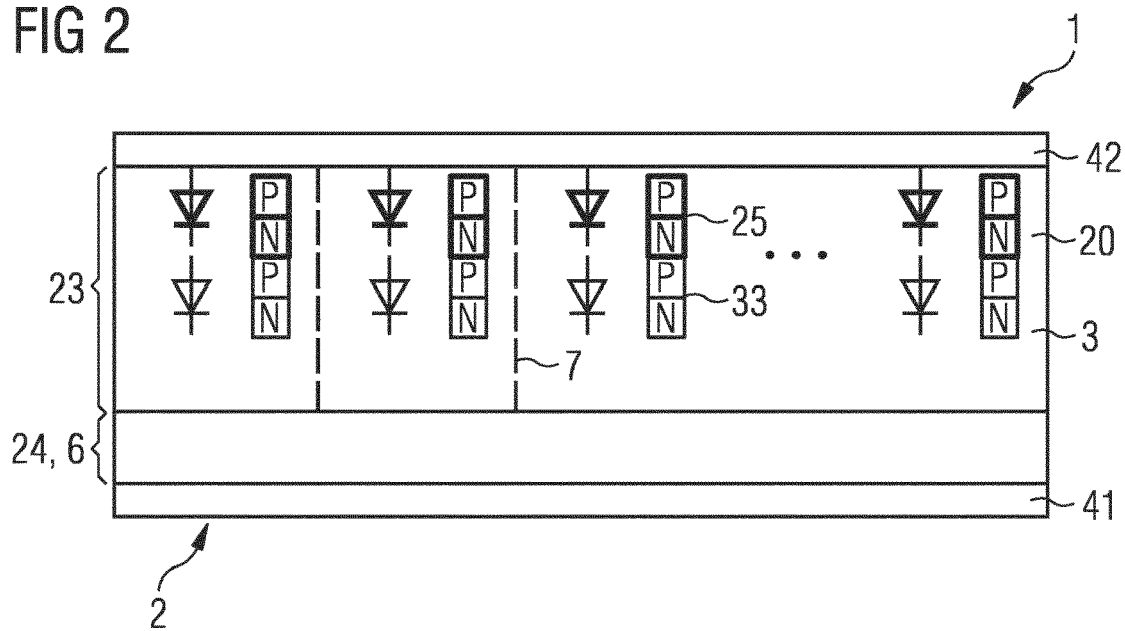

In the Figures:

FIGS. 1, 2 and 5 show schematic representations of exemplary embodiments of laser arrangements described here, FIGS. 3 and 4 show schematic sectional representations of exemplary embodiments of semiconductor lasers for laser arrangements described here, FIG. 6 shows schematic representations of electrical characteristic data of laser arrangements described here, and FIG. 7 shows a schematic representation of an emission spectrum of a laser arrangement described here.

FIG. 1A shows a side view and FIG. 1B shows a plan view of an exemplary embodiment of a laser arrangement 1. The laser arrangement 1 comprises a semiconductor layer sequence 23 on a growth substrate 24. Furthermore, a carrier 6 is provided which serves for electrical interconnection and/or as a heat sink.

The semiconductor layer sequence 23 is divided into a plurality of laser groups 2, wherein each laser group 2 is formed by a semiconductor laser 20. An emission of a laser radiation L occurs in an emission region 26 in the direction perpendicular to the plane of the drawing and in the direction perpendicular to a growth direction G, see FIG. 1A. A resonator direction R of the semiconductor lasers 20 is oriented parallel to the drawing plane and perpendicular to the growth direction G, see FIG. 1B.

The laser arrangement 1 of FIG. 1 is designed as a laser bar. The individual semiconductor lasers 20 are mechanically coupled to one another at least via the growth substrate 24 and have not been moved relative to one another after a growth process.

Optionally and preferred, as in all other exemplary embodiments, between adjacent laser groups 2 an optical insulation 7 is formed, for example by a trench in the semiconductor layer sequence 23, the trench being evacuated or filled with a gas such as air or nitrogen or argon. The trenches can alternatively be partially or completely filled with a reflective or absorbent material.

According to FIG. 1A, the optical insulations 7 and thus in particular the trenches extend continuously to the carrier 6. However, preferably the optical insulations 7 and thus the trenches do not completely separate the semiconductor layer sequence 23 and the optional growth substrate 24. For example, from a side facing away from the carrier 6, the optical insulations 7 separate the semiconductor layer sequence 23 to at least 25% and/or to at most 90%. Alternatively, from the side facing away from the carrier 7, the optical insulations 7 separate the semiconductor layer sequence 23 together with the growth substrate 24 to at least 5% or 15% or 25% or 50% and/or to at most 80% or 50% or 25%.

The semiconductor lasers 20, as shown in FIG. 1A, can be so-called gain-guided lasers. Alternatively, as also in all other exemplary embodiments, the semiconductor lasers 20 can be ridge waveguide lasers.

In contrast to the illustration in FIG. 1, the laser groups 2 can each contain a plurality of semiconductor lasers 20. All laser groups 2 and semiconductor lasers 20 of the laser arrangement 1 are preferably identical in construction and emit at the same wavelength. Alternatively, laser groups 2 or semiconductor lasers 20 emitting different colors can be present.

In FIG. 2, a further exemplary embodiment of the laser arrangement 1 is shown in a schematic sectional view. The growth substrate 24 can simultaneously function as a carrier 6. Electrical connections 41, 42 are located on the semiconductor layer sequence 23 and on the carrier 6, the electrical connections 41, 42 being formed, for example, by areal metallizations. Each of the laser groups 2 is thus provided with exactly two electrical contact surfaces, and the laser groups 2 are electrically connected in parallel. Unlike in FIG. 2, it is not absolutely necessary that the electrical connections 41, 42 are continuous surfaces. In particular, the second electrical connection 42 can be applied in a structured manner to the semiconductor layer sequence 23 so that the laser groups 2 can be electrically controllable independently of one another.

An npnp sequence of differently doped regions is present in each of the laser groups 2. Thus, in the semiconductor layer sequence 23 itself, on the one hand, a photothyristor 3 is realized and, on the other hand, the semiconductor laser 20 is realized with an active zone 25. The photothyristor 3 comprises an absorber layer 33 which is embedded in an n-side of the semiconductor laser 20 and is p-doped according to FIG. 2. In this case, the active zone 25 and the absorber layer 33 are optically directly coupled to one another and are not separated from one another by an intermediate layer which is impermeable to the laser radiation L. The active zone 25 thus serves as a light source for switching the photothyristor 3. The photothyristor 3 is thus an automatic switch which automatically electrically disconnects non-functioning laser groups 2 and prevents or at least greatly reduces a current flow through defective laser groups 2.

This functional principle is explained in more detail with reference to FIG. 6A. In FIG. 6A, the voltage U is plotted against a current I. An illumination intensity is symbolized by an arrow along the U axis.

If no illumination of the photothyristor 3 takes place, a dark breakdown voltage Ut is relatively large. As is usual in the case of a thyristor, the photothyristor 3 connects through when the dark breakdown voltage Ut is reached and becomes electrically conductive.

Semiconductor lasers functioning correctly generate significantly light at a normal laser threshold voltage Un so that the absorber layer 33 is illuminated and the photothyristor 3 is switched to a normal diode characteristic curve even at lower voltages. In particular, the photothyristor 3 is connected through because of the absorption of radiation in the absorber layer 33 at the intended operating voltage Ub. Thus, at the operating voltage Ub, an operating current Ib flows. At the normal laser threshold voltage Un, a threshold current In flows.

If a semiconductor laser 20 is defective and has an increased laser threshold voltage Ud, which lies above the operating voltage Ub, the associated absorber layer 33 is not illuminated or not significantly illuminated. Since the photothyristor 3 would in this case be connected through only at the increased laser threshold voltage Ud, but this voltage is above the operating voltage Ub, the defective semiconductor lasers 20 are electrically decoupled and are not energized or are only weakly energized.

The corresponding characteristic curves are shown in FIG. 6A. A laser power P as a function of the current I is schematically illustrated in FIG. 6B. An operating power Pb of the properly functioning semiconductor laser 20 is present at the operating current Ib, where the defective semiconductor lasers do not show any significant power consumption.

FIG. 3 illustrates a structure of the semiconductor layer sequence 23 in more detail. An n-conducting cladding layer 22 having a relatively low refractive index is located on the growth substrate 24, followed by an n-waveguide layer 21 on which the active zone 25 is located. The active zone 25 is followed by a p-waveguide layer 21, in turn followed by a p-cladding layer 22. The second electrical connection 42 is located on the p-cladding layer 22, which can be composed of a plurality of metal layers, for example of Au, Ni, Pd, Pt and/or Rh. Buffer layers or electrical contact layers of the semiconductor layer sequence 23 at the growth substrate 24 or at the second electrical connection 42 are not shown in order to simplify the illustration.

On the p-side of the semiconductor layer sequence 23, there is preferably an electron blocking layer 27. According to FIG. 3, the electron blocking layer 27 lies between the p-waveguide layer 21 and the p-cladding layer 22. Deviating therefrom, as in all other exemplary embodiments, the electron blocking layer 27 can be located closer to the active zone 25 in the p-waveguide layer 21 or also further away from the active zone 25 in the p-cladding layer 22.

The absorber layer 33 of the photothyristor 3 is located within the n-cladding layer 22. A distance D between the absorber layer 33 and the n-waveguide layer 21 is preferably approximately at one peak wavelength of the generated laser radiation L divided by twice the refractive index of the n-cladding layer 22. By such a distance D, it can be achieved that the absorber layer 33 absorbs, on the one hand, sufficient laser radiation L, but does not significantly impair the performance parameters of the semiconductor laser 20 on the other hand. The absorber layer 33 is p-doped. An npnp sequence of doped regions is thus realized in the semiconductor layer sequence 23.

The semiconductor layer sequence 23 is preferably based on AlInGaN. The two cladding layers 22 are formed from AlGaN, in particular with an aluminum content between 1% and 10% or between 4% and 6%. The waveguide layers 21 are formed from InGaN, wherein an indium content is preferably between 1% and 10% or between 2% and 6%. Alternatively, the cladding layers 22 can also be formed from GaN.

The active zone 25 is a single quantum well structure or a multiple quantum well structure. The electron blocking layer 27 is formed from AlGaN, for instance, and has a relatively small thickness of preferably at least 1 nm and/or at most 20 nm. A thickness of the waveguide layers 21 is preferably at least 100 nm and/or at most 500 nm, wherein the waveguide layers 21 can be of different thicknesses. The n-cladding layer 22, including the absorber layer 33, has preferably a thickness of 1 µm to 4 µm, preferably approximately 2 µm. A thickness of the absorber layer 33 is in particular at least 20 nm and/or at most 500 nm. The absorber layer 33 is formed of AlInGaN, wherein an absorption edge of the absorber layer 33 is set such that the laser radiation L can be absorbed.

A thickness of the absorber layer 33 is preferably at least 0.001 times or 0.01 times or 0.1 times a total thickness of the n-cladding layer and the n waveguide layer 21. Alternatively or additionally, the thickness of the absorber layer 33 is at most 0.5 times or 0.2 times or 0.1 times this total thickness.

The n-cladding layer 22 is n-doped with silicon, for example. The absorber layer 33 lying in the n-cladding layer 22 is either free of the n-doping of the n-cladding layer 22 or an n-dopant concentration is reduced by at least a factor of 2 or 5 or 10. The absorber layer 33 is doped, for example, with magnesium or has a co-doping of carbon and magnesium. The absorber layer 33 can be of one or more undoped layers or low n-doped layers having an Si concentration $<5 \times 10^{17}$ cm$^{-3}$, which can be co-doped with carbon in the case of MOVPE growth, so that effectively a p-conductivity results. This means that the C concentration is then higher than the Si concentration. Likewise, a defined Mg doping with a concentration of Mg$>5 \times 10^{17}$ cm$^{-3}$ is possible for the absorber layer. Preferably, all these values also apply accordingly in all other exemplary embodiments.

FIG. 4 shows a further exemplary embodiment of the semiconductor laser 20. In contrast to FIG. 3, the absorber layer 33 is located in the p-cladding layer 22a and is thus n-doped. The electron blocking layer 27 lies within the p-waveguide layer 21. Otherwise, the exemplary embodiment of FIG. 4 corresponds to that of FIG. 3; the description to FIG. 3 applies analogously.

As in all exemplary embodiments, the p-cladding layer can also be composed of the semiconductor layer 22a and a layer 22b, wherein the layer 22b is formed from a transparent conductive oxide such as ITO.

In the exemplary embodiment of FIG. 5, no laser bar is present, but separate laser diode chips with the individual laser groups 2 are present in a plurality of series connections connected in parallel with one another. Each of the laser groups 2 comprises one of the photothyristors 3. Preferably, there are significantly more parallel connections than laser groups 2 are arranged in the series connections.

Series connections comprising a defective laser group are blocked on account of the photothyristors 3. The series connections thus function only if all the photothyristors 3 in one of the series connections are illuminated and connect through. The individual laser groups 2 and laser diode chips are mounted next to one another on a common carrier and/or heat sink, for example.

FIG. 7 shows that the absorption edge Eg of the absorber layer 33 is preferably located in a red, that is long-wave flank of the emission spectrum of the laser radiation L. Thus, essentially the entire laser radiation L can be absorbed by the absorber layer 33 with regard to the wavelength distribution thereof. In contrast to this, it is possible for the absorption edge Eg to lie in the blue flank or in the peak wavelength λp.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

This patent application claims the priority of German patent application 10 2016 108 700.9, the disclosure content of which is hereby incorporated by reference.

LIST OF REFERENCE SIGNS 1 laser arrangement
2 laser group
20 semiconductor laser
21 waveguide layer
22 cladding layer
23 semiconductor layer sequence
24 growth substrate
25 active zone
26 emission region
27 electron blocking layer
3 photothyristor 33 absorber layer
41 first electrical connection
42 second electrical connection
6 carrier
7 optical isolation
D distance absorber layer—waveguide layer
Eg absorption edge of the absorber layer
G growth direction
I current in arbitrary units
L laser radiation
n, p n-doped or p-doped region
P laser power in arbitrary units
R resonator direction
U voltage in arbitrary units
Ub operating voltage
Ud increased laser threshold voltage of defect lasers
Un normal laser threshold voltage
Ut dark breakdown voltage
λ wavelength in arbitrary units
λp peak wavelength of the laser radiation

The invention claimed is:

1. A laser arrangement comprising:
   a plurality of laser groups, each having at least one semiconductor laser, and
   a plurality of photothyristors so that each of the laser groups is uniquely assigned to one of the photothyristors, wherein
   the photothyristors are electrically connected in series to the associated laser group or are integrated into the associated laser group,
   the photothyristors are each optically coupled to the associated laser group,
   the photothyristors each have a dark breakdown voltage (Ut) which lies above an intended operating voltage (Ub) of the associated laser group,
   the photothyristor and the associated laser group are configured monolithically, and
   the photothyristor and the associated laser group have the same electrical connection for an n side and the same electrical connection for a p side.

2. The laser arrangement according to claim 1, wherein:
   adjacent laser groups are optically isolated from one another,
   the photothyristors each have an absorber layer which is configured to absorb a part of a laser radiation (L) generated during operation of the associated laser group, and thus to increase a conductivity of the associated photothyristor, and
   each of the laser groups is provided with exactly two electrical contact surfaces.

3. The laser arrangement according to claim 1, wherein the laser groups each consist of exactly one semiconductor laser, wherein the semiconductor lasers each comprise a semiconductor layer sequence into which the associated photothyristor is integrated so that in the semiconductor layer sequences in each case a pnpn sequence is present, which comprises the associated photothyristor and an active zone of the corresponding semiconductor laser.

4. The laser arrangement according to claim 3,
   wherein all semiconductor lasers are produced from the common semiconductor layer sequence and are present on a common growth substrate, wherein the semiconductor layer sequence is based on the material system AlInGaN and the semiconductor lasers are configured to generate visible laser radiation (L).

5. The laser arrangement according to claim 2, wherein an evanescent field from a laser radiation (L) guided in a waveguide layer extends to the absorber layer.

6. The laser arrangement according to claim 5, wherein for a distance D between the absorber layer and the waveguide layer with regard to a peak wavelength λp and a refractive index n of the cladding layer the following applies: 0.25 n λp≤D≤0.75 n λp, wherein a thickness (T) of the absorber layer is between 20 nm and 150 nm inclusive.

7. The laser arrangement according to claim 2, wherein the absorber layer has an absorption edge Eg, wherein Eg≤h c/(λp−5 nm), λp is a peak wavelength of the associated laser radiation (L), wherein the absorber layer absorbs a total of at most 5% of the laser radiation (L).

8. The laser arrangement according to claim 2, wherein the absorber layer is p-doped and is composed of the material system $Al_xIn_yGa_{1-x-y}N$, wherein the cladding layer is n-doped and is from the material system $Al_zGa_{1-z}N$ with 0.01≤y, z≤0.1 and 0≤x≤0.1.

9. The laser arrangement according to claim 2, wherein the absorber layer is n-doped and is composed of the material system $Al_xIn_yGa_{1-x-y}N$, wherein the cladding layer is p-doped from the material system $Al_zGa_{1-z}N$ with 0.01≤y, z≤0.1 and 0≤x≤0.1.

10. The laser arrangement according to claim 1, wherein the dark breakdown voltage (Ut) exceeds the intended operating voltage (Ub) by at least 0.3 V and by at most 1 V, wherein the intended operating voltage (Ub) is between 3.5 V and 8 V inclusive.

11. The laser arrangement according to claim 1, wherein adjacent laser groups are optically isolated from one another so that the photothyristors are not irradiated during operation by an adjacent laser group which is not assigned to said laser group.

12. The laser arrangement according to claim 1, which is an edge-emitting laser bar, wherein all laser groups are arranged next to one another when viewed in plan view, wherein the exactly two electrical connections are present per laser group, and wherein the laser arrangement comprises at least 5 and at most 100 of the laser groups or of the semiconductor lasers and an intended optical output power is at least 10 W.

13. The laser arrangement according to claim 1, comprising n×m of the laser groups, wherein there are m series connections having n series-connected laser groups and the m series connections are electrically connected in parallel to one another, wherein n, m are natural numbers and n≤m$^{0.5}$.

14. The laser arrangement according to claim 1, wherein, during operation, only some of the laser groups generates the laser radiation (L) at the intended operating voltage (Ub) and at least one laser group is decoupled by means of the associated photothyristor so that no or no significant current flows through the at least one decoupled laser group during operation of the laser arrangement.

15. An operating method by means of which the laser arrangement of claim 1 is operated, wherein the laser arrangement has at least one defective laser group with an increased laser threshold voltage (Ud) and the increased laser threshold voltage (Ud) is greater than the intended operating voltage (Ub), wherein a normal laser threshold voltage (Un) of the correctly functioning laser groups is below the intended operating voltage (Ub) so that in these laser groups the associated photothyristor is illuminated and switched through because of the generated laser radiation (L), whereas in the at least one defective laser group, no laser radiation or only very little laser radiation (L) is generated and the associated photothyristor is not sufficiently illuminated so that the at least one defective laser group remains electrically decoupled up to the intended operating voltage (Ub) and a current flow through the at least one defective laser group is by at least a factor of 10 lower than through the correctly functioning laser groups.

16. The laser arrangement according to claim 1, wherein the photothyristors are electrically connected in series to the associated laser group.

17. The laser arrangement according to claim 1, wherein the photothyristors each have an absorber layer wherein the absorber layer is composed of $Al_xIn_yGa_{1-x-y}N$ with $0 \leq x \leq 1$, $0 \leq y \leq 1$, and $x+y \leq 0.1$.

* * * * *